United States Patent [19]

Kondo

[11] Patent Number: 5,470,785
[45] Date of Patent: * Nov. 28, 1995

[54] METHOD OF MANUFACTURING BURIED HETEROSTRUCTURE SEMICONDUCTOR LASER

[75] Inventor: Yasuhiro Kondo, Kanagawa, Japan

[73] Assignee: Nippon Telegraph and Telephone Corporation, Tokyo, Japan

[*] Notice: The portion of the term of this patent subsequent to Nov. 9, 2010, has been disclaimed.

[21] Appl. No.: 133,507

[22] Filed: Oct. 7, 1993

Related U.S. Application Data

[63] Continuation of Ser. No. 909,953, Jul. 7, 1992, Pat. No. 5,260,230.

[30] Foreign Application Priority Data

Jul. 12, 1991 [JP] Japan ..................... 3-172059
Oct. 7, 1991 [JP] Japan ..................... 3-285470

[51] Int. Cl.[6] ................. H01L 21/20; H01L 21/203
[52] U.S. Cl. ................. 437/129; 437/133; 437/107
[58] Field of Search .................. 437/105, 107, 437/129, 133; 372/43, 45, 46

[56] References Cited

PUBLICATIONS

Kawabata et al. in J. Appl. Phys. vol. 64(7), Oct. 1988, pp. 3684–3688.

Nelson et al. in Electronic letters vol. 21(20), Sep. 1985, pp. 888–889.

*Primary Examiner*—R. Bruce Breneman
*Assistant Examiner*—Ramamohan Paladugu
*Attorney, Agent, or Firm*—Blakely, Sokoloff, Taylor & Zafman

[57] ABSTRACT

According to a method of manufacturing a buried heterostructure semiconductor laser, an active layer and a p-type cladding layer are sequentially deposited on an n-type group III-V semiconductor substrate by metalorganic vapor phase epitaxy. A surface of the deposited layer is masked in a stripe shape, and the cladding layer, the active layer, and the semiconductor substrate are selectively and partially etched to form a mesa structure. A p-type current blocking layer, an n-type current confining layer containing a group VI dopant having a concentration of not less than $5 \times 10^{18}$ atoms·cm$^{-3}$, a p-type cladding layer, and a p-type cap layer are sequentially deposited on an entire upper surface of the mesa structure by the metalorganic vapor phase epitaxy.

22 Claims, 7 Drawing Sheets

METHOD OF MANUFACTURING BURIED HETEROSTRUCTURE SEMICONDUCTOR LASER

This is a continuation of application of Ser. No. 07/909,953, filed Jul. 7, 1992, now U.S. Pat. No. 5,260,230.

BACKGROUND OF THE INVENTION

The present invention relates to a method of manufacturing a buried heterostructure semiconductor laser and, more particularly, to a method of manufacturing a buried heterostructure semiconductor laser using metalorganic vapor phase epitaxy.

When a buried heterostructure semiconductor laser is to be manufactured, the step of burying a mesa structure including an active region is required. When this step is performed by metalorganic vapor phase epitaxy, since a growth rate of a metalorganic vapor phase epitaxy is controlled by a mass transport mechanism, abnormal growth occurs at both the ends of the mesa structure. For this reason, it is difficult to bury the mesa structure flat.

Figure 7:
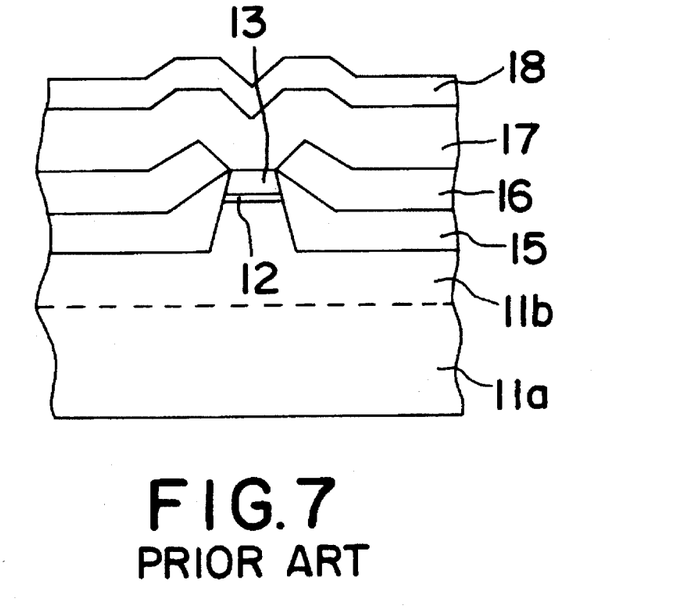
FIGS. 7 and 8 are sectional views for explaining element structures of conventional buried heterostructure semiconductor lasers, respectively.
Figure 8:
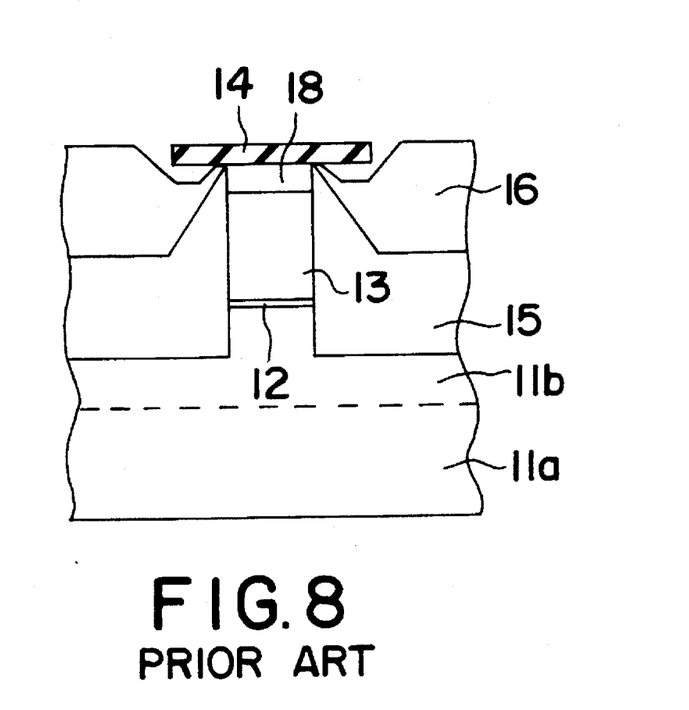

In a conventional technique, as shown in FIG. 7, a mesa structure having a small height (h<1 μm) is used, and growth of a buried layer is repeated twice to form a buried heterostructure laser element. Alternatively, as shown in FIG. 8, when a mesa structure having a large height is to be used, a selection mask 14 on the upper portion of the mesa structure is formed as an overhang to suppress the growth of both the ends of the mesa structure, and buried layers are grown to form the laser structure. In FIGS. 7 and 8, reference numeral 11a denotes an n-type InP substrate; 11b, an Se-doped n-type InP buffer layer on the substrate 11a; 12, an undoped InGaAsP active layer; 13, a p-type InP cladding layer; and 14, an SiO$_2$ film for forming a selection mask. In addition, reference numeral 15 denotes a p-type InP current blocking layer; 16, an n-type InP current confining layer; 17, a p-type InP over-cladding layer; and 18, a p-type InGaAsP cap layer.

According to the conventional technique using the mesa structure having a small height shown in FIG. 7, however, a film thickness of 1.2 μm or more is required to sufficiently block a current by a p-n reverse bias of buried layers consisting of the p-type InP current blocking layer 15 and the n-type InP current confining layer 16. As a result, as shown in FIG. 7, the buried layers largely protrude (1.0 μm or more) at both the ends of the mesa structure. When the buried layers protrude at both the ends of the mesa structure, it is difficult that a buried layer is grown by the second growth of a buried layer to flatten the surface of an element, and trouble may occur in the steps of isolating electrodes and elements.

In addition, according to the conventional technique using the selection mask having an overhang, as shown in FIG. 8, the mesa structure must be formed by wet etching, and the controllability of a mesa shape is not good. For this reason, uniformity and controllability of laser characteristics are degraded and the yield of lasers is decreased accordingly.

SUMMARY OF THE INVENTION

It is a principal object of the present invention to provide a method of manufacturing a high-performance buried heterostructure semiconductor laser capable of obtaining a flat buried layer.

It is another object of the present invention to provide a method of manufacturing a buried heterostructure semiconductor laser in which a high-performance semiconductor laser can be manufactured by simple manufacturing steps.

In order to achieve the above objects, according to the present invention, there is provided a method of manufacturing a buried heterostructure semiconductor laser, comprising the steps of sequentially depositing an active layer and a p-type cladding layer on an n-type group III-V semiconductor substrate by metalorganic vapor phase epitaxy, masking a surface of the deposited layer in a stripe shape and selectively and partially etching the cladding layer, the active substrate, and the semiconductor substrate to form a mesa structure, and sequentially depositing a p-type current blocking layer, an n-type current confining layer containing a group VI dopant having a concentration of not less than $5 \times 10^{18}$ atoms·cm$^{-3}$, a p-type cladding layer, and a p-type cap layer on an entire upper surface of the mesa structure by metalorganic vapor phase epitaxy.

DESCRIPTION OF THE PREFERRED EMBODIMENTS

FIGS. 1A to 1D show the steps in manufacturing a buried heterostructure semiconductor laser according to an embodiment of the present invention.

Figure 1A:
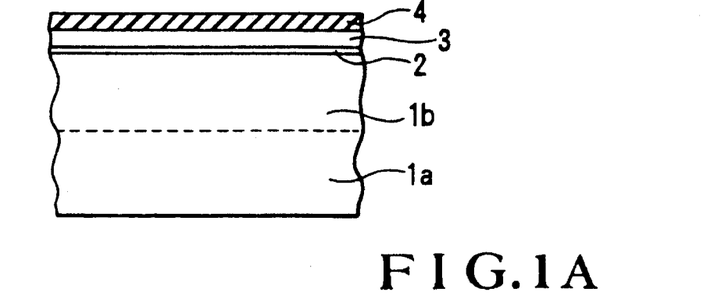
FIGS. 1A to 1D are sectional views showing the steps in manufacturing a buried heterostructure semiconductor laser according to an embodiment of the present invention.

As shown in FIG. 1A, an Se-doped n-type InP buffer layer 1b (film thickness: d=0.1 μm), an undoped InGaAsP active layer 2 (d=0.1 μm), and a p-type InP cladding layer 3 (d=0.3 μm) are grown on a (100) plane n-type InP substrate 1a by metalorganic vapor phase epitaxial growth (MOVPE).

An SiO$_2$ film 4 is deposited on the grown surface of the resultant structure by sputtering.

Figure 1B:
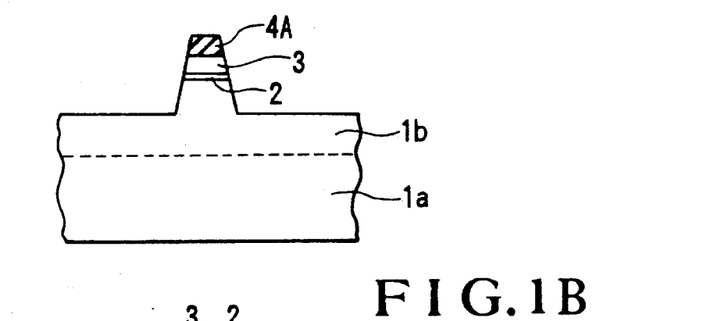

As shown in FIG. 1B, an SiO$_2$ stripe mask 4A having a stripe width of 1.5 μm is formed in the <011> direction by a photolithographic technique. The cladding layer 3, the active layer 2, the buffer layer 1b, and the substrate 1a are partially removed by etching using a chlorine-argon reactive ion etching (RIE) device to form a mesa structure having a height of about 1.0 μm. At this time, since this mesa structure is formed by all dry processes, the shape of the mesa structure has high controllability.

Figure 1C:
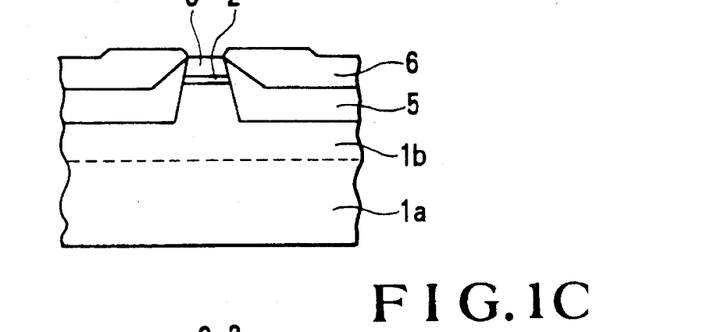

As shown in FIG. 1C, the SiO$_2$ stripe mask 4A formed by the SiO$_2$ film 4 constituting the upper layer of the mesa structure is directly used as a selective growth mask, and a Zn-doped p-type InP current blocking layer 5 and an Se-doped n-type InP current confining layer 6 are sequentially grown by MOVPE to bury regions other than the mesa structure. The p-type InP layer 5 and the n-type InP layer 6 serve as a current constraint layer and an optical confinement layer. At this time, the concentration of Se doped in the n-type InP layer 6 is set to be $5 \times 10^{18}$ atoms·cm$^{-3}$ or more. In this manner, since the n-type InP buried layer 6 on the side surface of the mesa structure is grown while its (100) facet is exposed, and the growth of the (100) facet plane is suppressed. For this season, since a (100) off-angle portion is grown at a high rate, the surface of the buried layer on the side surface of the mesa structure has the exposed (100) plane so as to be flattened. The SiO$_2$ film constituting the upper portion of the mesa structure is removed by HF.

Figure 1D:
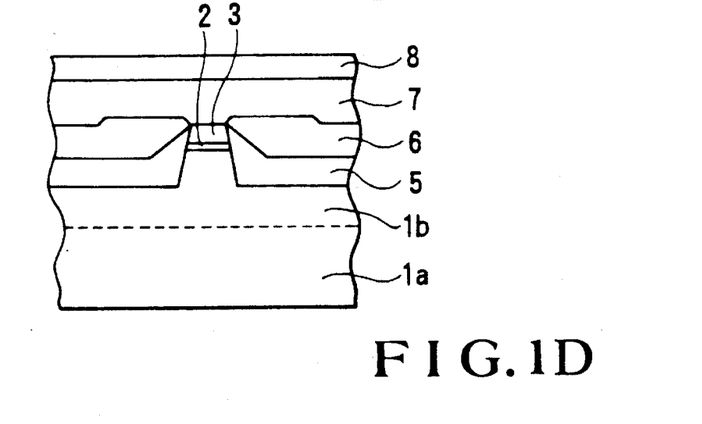

Thereafter, as shown in FIG. 1D, a p-type over-cladding layer 7 (d=1.0 μm) and a p-type InGaAsP cap layer 8 (d=0.5 μm) are sequentially grown on the entire surface of the substrate by MOVPE. Since the substantially flat crystal surface is obtained when the first growth of a buried layer is performed, an element structure having a flat surface can be obtained after the second growth of a buried layer is performed on the entire surface of the substrate.

As described above, since high-concentration n-type InP containing a group VI dopant is used, the flat buried layer can be obtained, and a high-performance semiconductor layer can be obtained.

The growth of InP is suppressed in the small region on the (100) plane when the Se-doped n-type InP current confining layer 6 is formed, because Se eliminates the surface level of the (100) plane of the InP to stabilize the (100) plane. The surface smoothing effect is obtained by adsorbing group VI atoms (Se and S) in the surface of a group III-V semiconductor.

As a device used in MOVPE, a high-frequency heating low-pressure vertical metalorganic vapor phase epitaxial growth device was used. A growth temperature was set to be 620° C. and a growth pressure was set to be 50 Torr. The following materials were used as source gases. For example, hydrides of P and As such as phosphine PH$_3$ and arsine AsH$_3$ were used as group V sources, and organic metals of In and Ga such as TMIn and TEGa were used as group III sources. DEZn and H$_2$Se were used as the p-type dopant and the n-type dopant, respectively. In addition, a growth rate was set to be 330 Å/min (2.0 μm/h) during burying of InP, and a V/III ratio (PH$_3$/TMIn) was set to be 120.

Figure 5:
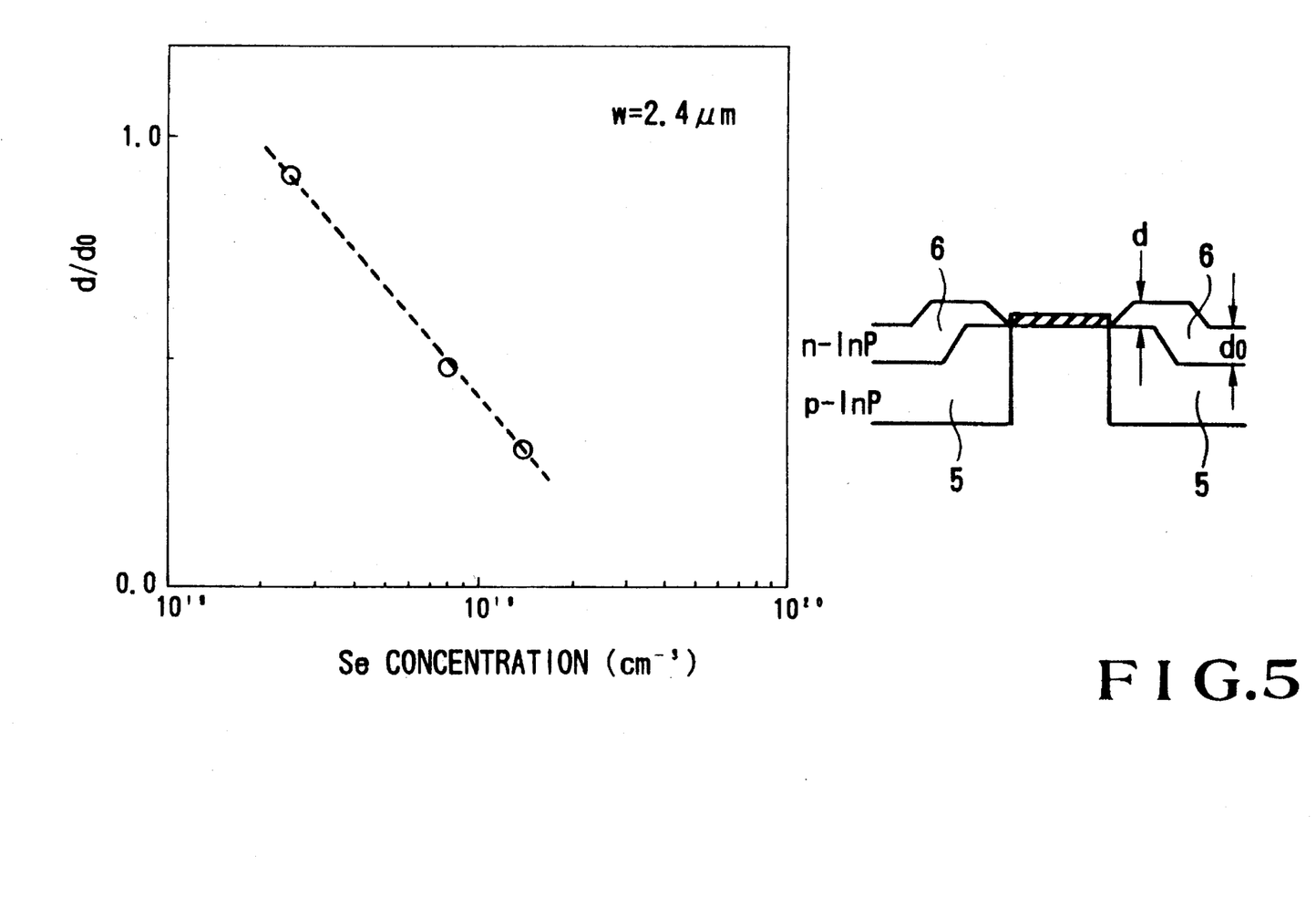
FIGS. 5 and 6 are graphs each showing concentration dependency on the grown film thickness of an Se-doped InP current confining layer.

The concentration dependency on the grown film thickness of the growth of the Se-doped n-type InP layer 6 is given as a characteristic curve shown in FIG. 5. In FIG. 5, reference symbol w represents the width of the top of the mesa structure; d, the thickness of a portion of the current confining layer 6 adjacent to the mesa structure; and $d_0$, the thickness of a portion of the current confining layer 6 apart from the mesa structure. According to this characteristic curve, the following is found. That is, when the concentration of doped Se is set to be $5 \times 10^{18}$ atoms·cm$^{-3}$ or more, $d/d_0$ has a sufficiently small value, and the growth of the (100) facet plane is sufficiently suppressed.

Figure 6:
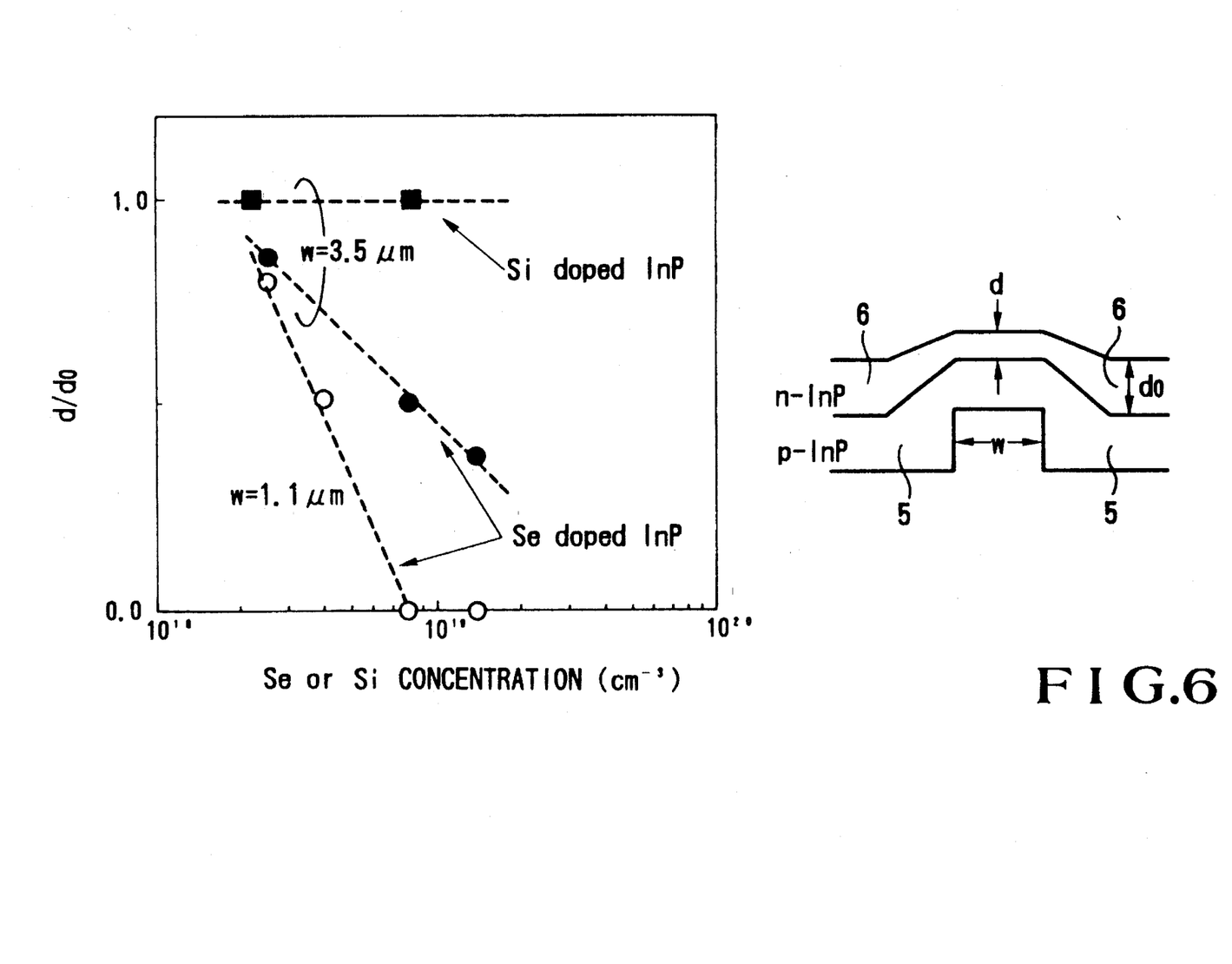

FIG. 6 shows concentration dependency on the grown film thickness of the Se-doped n-type InP layer 6 formed on the p-type InP layer 5 when the width w of the top of the mesa structure is varied, and FIG. 6 shows a relationship between the concentration dependency of the Se-doped n-type InP layer 6 and the concentration dependency of an Si-doped n-type InP layer which is obtained to be compared with that of the Se-doped n-type InP layer 6. As is apparent from FIG. 6, it is understood that a growth suppressing effect is larger when Se is doped than when Si is doped. In addition, as the width of the top of the mesa structure is varied, i.e., as the width is decreased, the growth suppressing effect becomes large.

Figure 2A:
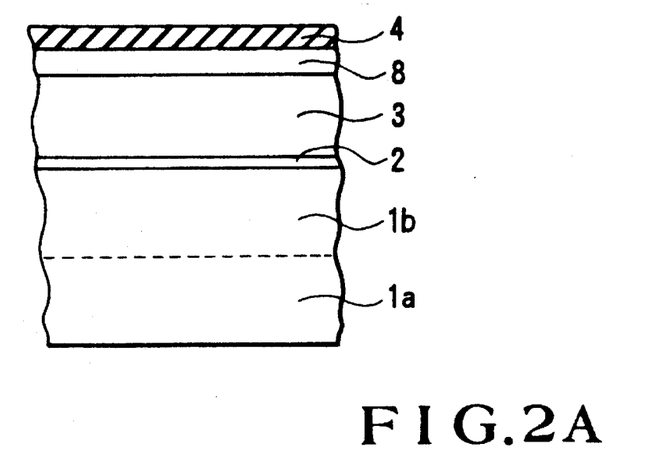
FIGS. 2A to 2C are sectional views showing the steps in manufacturing a buried heterostructure semiconductor laser according to another embodiment of the present invention.
Figure 2B:
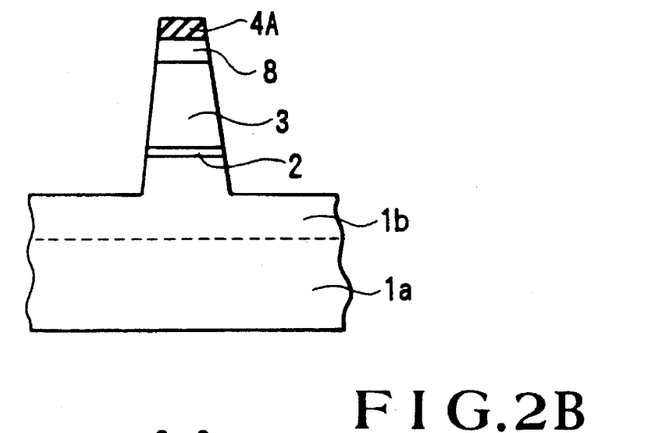
Figure 2C:
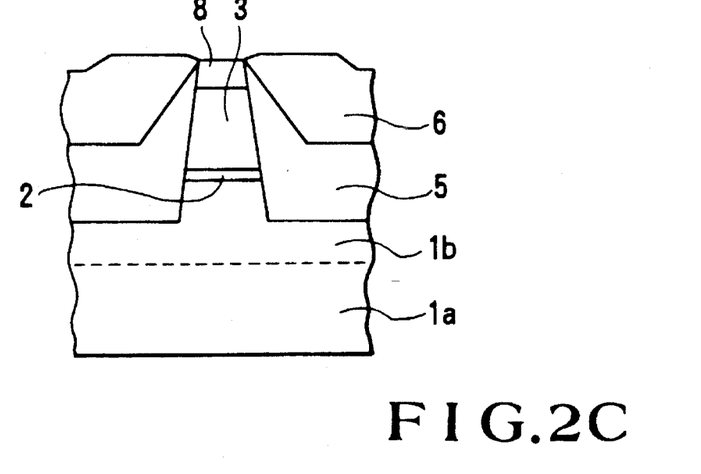

FIGS. 2A to 2C show the steps in manufacturing a semiconductor laser according to another embodiment of the present invention. The same reference numerals as in FIGS. 1A to 1D denote the same parts in FIGS. 2A to 2C.

As shown in FIG. 2A, an Se-doped n-type InP buffer layer 1b (d=0.1 μm), an undoped InGaAsP active layer 2 (d=0.1 μm), a p-type InP cladding layer 3 (d=1.2 μm), and a p-type InGaAsP cap layer 8 (d=0.5 μm) are grown on a (100) plane n-type InP substrate 1a by MOVPE. An SiO$_2$ film 4 is deposited on the grown surface by sputtering.

As shown in FIG. 2B, an SiO$_2$ stripe mask 4A having a stripe width of 1.5 μm is formed in the <011> direction by a photolithographic technique. A chlorine-argon reactive ion etching (RIE) device is used to form a mesa structure having a height of about 2.0 μm.

The SiO$_2$ stripe mask 4A formed by the SiO$_2$ film 4 constituting the upper layer of the mesa structure is directly used as a selective growth mask, and a Zn-doped p-type InP current blocking layer 5 and an Se-doped n-type InP current confining layer 6 are sequentially grown by MOVPE to bury regions other than the mesa structure, as shown in FIG. 2C. The p-type InP layer 5 and the n-type InP layer 6 serve as a current constraint layer and an optical confinement layer. At this time, the concentration of Se doped in the n-type InP layer 6 is set to be $5 \times 10^{18}$ atoms·cm$^{-3}$ or more. In this manner, since the n-type InP buried layer 6 on the side surface of the mesa structure is grown while its (100) facet is exposed, the growth of the (100) facet plane is suppressed, and a (100) off-angle portion is grown at a high rate. For this reason, the surface of the buried layer has the exposed (100) plane so as to be flattened. The SiO$_2$ film 4A constituting the upper portion of the mesa structure is removed by HF.

Since the element manufactured as described above uses the characteristic features of growth of a buried layer, the mesa structure is not limited, and a laser element having a flat surface can be manufactured.

FIGS. 3A to 3D show a method in manufacturing a semiconductor laser according to still another embodiment of the present invention. The same reference numerals as in FIGS. 1A to 1D denote the same parts in FIGS. 3A to 3D. This embodiment has the following principal characteristic feature. A group VI dopant such as Se is doped in an n-type buried layer in the step of burying a mesa structure using metalorganic vapor phase epitaxy, and a growth suppressing mechanism of a (100) small region which is a characteristic feature of the group VI dopant heavily doped n-type group III-V compound semiconductor is used, thereby burying the mesa structure without a selection mask.

Figure 3A:
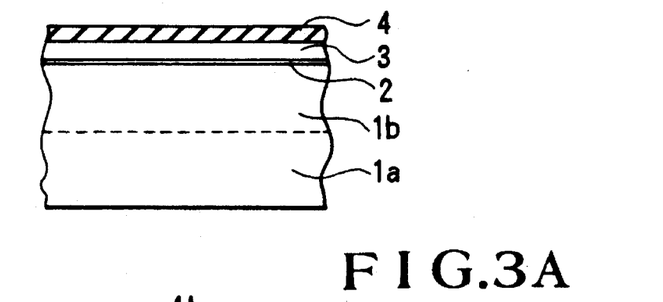
FIGS. 3A to 3D are sectional views showing the steps in manufacturing a buried heterostructure semiconductor laser according to still another embodiment of the present invention.

As shown in FIG. 3A, an Se-doped n-type InP buffer layer 1b (film thickness: d=0.1 μm), an undoped InGaAsP active layer 2 (d=0.1 μm), and a p-type InP cladding layer 3 (d=0.3 μm), are grown on a (100) plane n-type InP substrate 1a by metalorganic vapor phase epitaxy (MOVPE). An SiO$_2$ film 4 is deposited on the grown surface by sputtering.

Figure 3B:
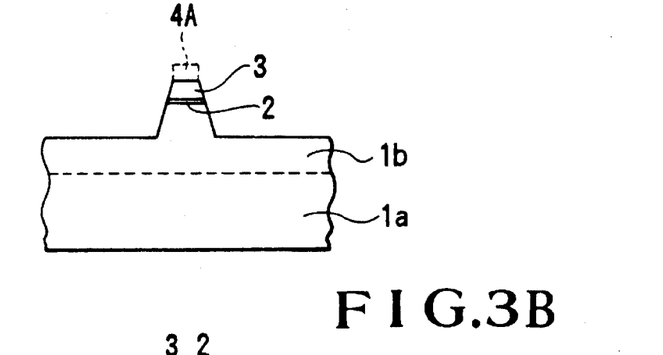

As shown in FIG. 3B, an SiO$_2$ stripe mask 4A having a stripe width of 1.5 μm is formed in the <011> direction by a photolithographic technique. A chlorine-argon reactive ion etching (RIE) device is used to form a mesa structure having a height of about 1.0 μm. The SiO$_2$ film 4A constituting the upper layer of the mesa structure is removed by HF.

Figure 3C:
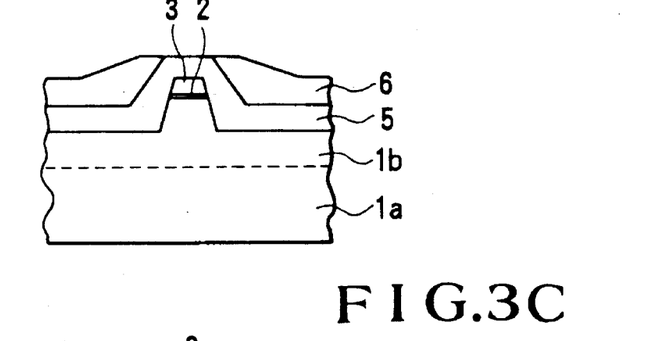

As shown in FIG. 3C, a Zn-doped p-type InP current blocking layer 5 and an Se-doped n-type InP current confining layer 6 are sequentially grown by MOVPE. The p-type InP layer 5 and the n-type InP layer 6 serve as a current constraint layer and an optical confinement layer. At this time, when the concentration of Se doped in the n-type InP layer 6 is set to be $5\times10^{18}$ atoms·cm$^{-3}$ or more, the growth of the n-type InP buried layer 6 on the mesa structure is suppressed. For this reason, the upper portion of the mesa structure has a layered structure in which only the p-type InP layer 5 is grown. As is apparent from FIG. 6, when the concentration of Se doping is set to be $8\times10^{18}$ atoms·cm$^{-3}$ or more, the growth of the buried layer 6 on the mesa structure is entirely suppressed.

Figure 3D:
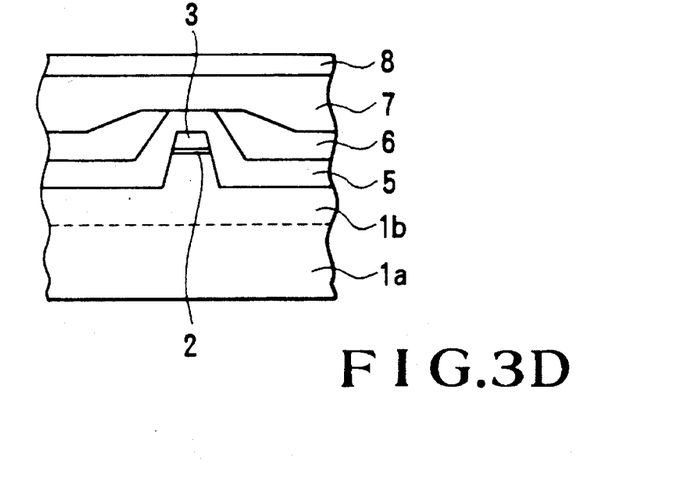

Sequentially, as shown in FIG. 3D, a p-type InP over-cladding layer 7 (d=1.0 µm) and a p-type InGaAsP cap layer 8 (d=0.5 µm) are sequentially grown on the entire surface of the substrate by MOVPE. The p-type Inp layer 7 and the p-type InGaAsP layer 8 are also grown on the mesa structure and constitute the element structure.

In the element manufactured as described above, since the high-concentration n-type InP layer 6 using an Se dopant is used, a condition under which the n-type InP layer 6 is not formed on the mesa structure can be obtained. For this reason, a buried heterostructure laser element can be manufactured by one growth of a buried layer performed by MOVPE without a selection mask.

FIGS. 4A to 4D show a method in manufacturing a semiconductor laser according to still another embodiment of the present invention. The same reference numerals as in FIGS. 1A to 1D denote the same parts in FIGS. 4A to 4D.

Figure 4A:
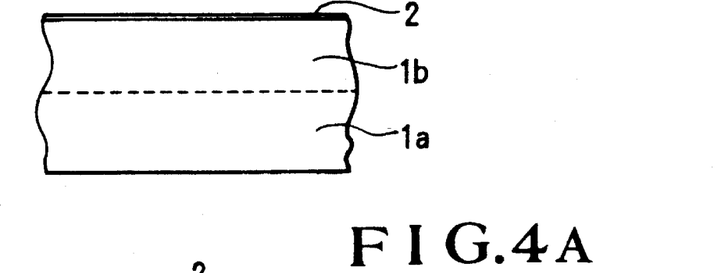
FIGS. 4A to 4D are sectional views showing the steps in manufacturing a buried heterostructure semiconductor laser according to still another embodiment of the present invention.
Figure 4B:
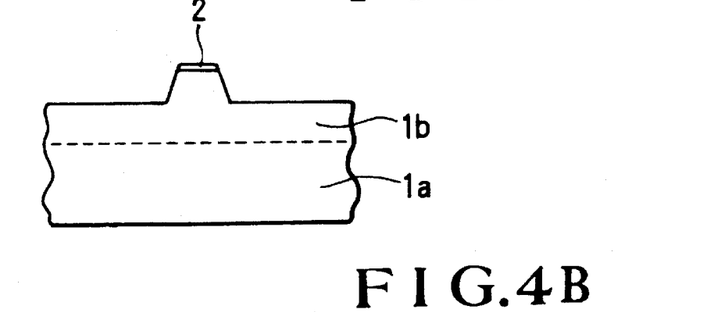

As shown in FIG. 4A, an Se-doped n-type InP buffer layer 1b (d=0.1 µm) and an undoped InGaAsP active layer 2 (d=0.1 µm) are grown on a (100) plane n-type InP substrate la by MOVPE.

Figure 4C:
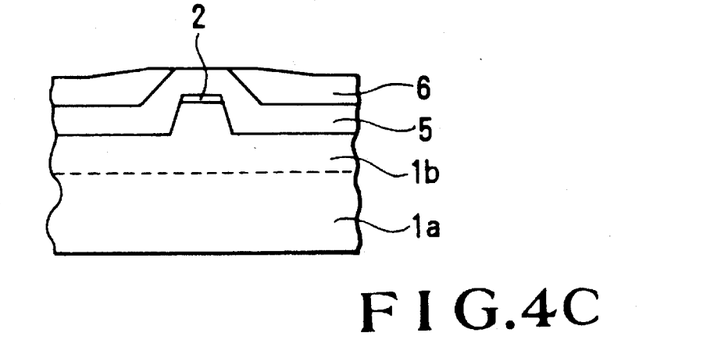
Figure 4D:
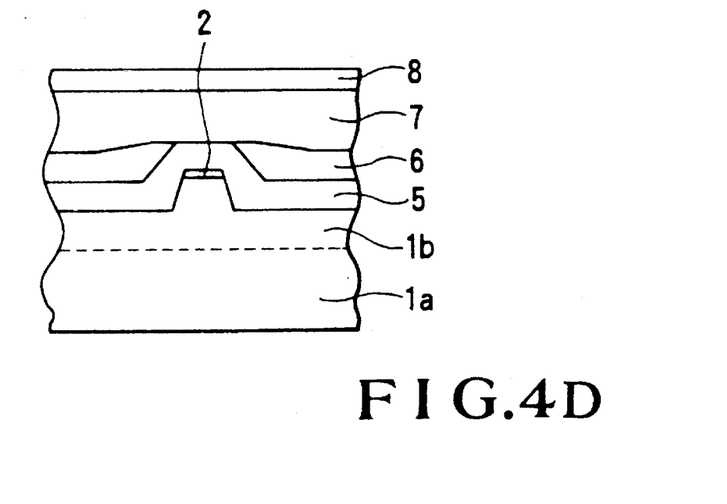

As in the embodiment shown in FIGS. 3A to 3D, a mesa structure having no mask in the <011> direction is formed (FIG. 4B), and a Zn-doped p-type InP current blocking layer 5 and an Se-doped n-type InP current confining layer 6 are grown using MOVPE (FIG. 4C). Subsequently, a p-type InP over-cladding layer 7 (d=1.0 µm) and a p-type InGaAsP cap layer 8 (d=0.5 µm) are grown on the entire surface of the substrate to form an element structure (FIG. 4D).

In the element manufactured as described above, since a selection mask is not used, a buried heterostructure laser element can be manufactured by one growth of a buried layer as in the embodiment shown in FIGS. 3A to 3D.

In the embodiment shown in FIGS. 4A to 4D, after the undoped InGaAs active layer 2 is grown (FIG. 4A), an optical waveguide layer is grown. Thereafter, a diffraction grating is formed in the optical waveguide layer, and a mesa structure is formed as in the step in FIG. 4B. A distributed feedback laser element is manufactured in the same steps as those in FIGS. 4C and 4D. In this case, a regrowth of the p-type InP cladding layer performed after the diffraction grating is formed can be advantageously omitted.

As described above, according to the embodiments shown in FIGS. 3A to 3D and FIGS. 4A to 4D, when a growth suppressing effect in a small region of the (100) plane of a heavily doped n-type III-V group semiconductor using a group VI dopant such as Se is used, a mesa structure having no mask for selective growth can be buried by one growth using metalorganic vapor phase epitaxy. For this reason, the steps in manufacturing a buried heterostructure laser can be advantageously simplified.

In the above embodiments, although a chlorine-argon dry etching is used as a method of forming a mesa structure, the mesa structure may be formed by another method.

In the above embodiments, although Se is used as a group VI dopant, another group VI dopant such as S may be used because the surface smoothing effect can be obtained by using not only Se but other group VI elements.

In addition, in the above embodiments, the InP/InGaAsP semiconductors have been described above. However, any other group III-V semiconductors such as GaAs/AlGaAs semiconductors having the surface smoothing effect (the effect is confirmed in the GaAs/AlGaAs semiconductors) can be applied to the present invention.

What is claimed is:

1. A method of manufacturing a buried heterostructure semiconductor laser, comprising the steps of:

sequentially depositing an active layer and a p-type cladding layer on an n-type group III-V semiconductor substrate by metalorganic vapor phase epitaxy;

masking a surface of said deposited layer in a stripe shape and selectively and partially etching said cladding layer, said active layer, and part of said semiconductor substrate to form a mesa structure; and sequentially depositing a p-type current blocking layer, an n-type current confining layer containing a group VI dopant having a concentration of not less than $5\times10^{18}$ atoms·cm$^{-3}$, a p-type cladding layer, and a p-type cap layer on an entire upper surface of said mesa structure by the metalorganic vapor phase epitaxy.

2. A method according to claim 1, wherein said n-type semiconductor substrate consists of an n-type semiconductor substrate (1a) and an n-type buffer layer (1b) formed on said n-type semiconductor substrate (1a).

3. A method according to claim 1, wherein the step of selectively and partially etching said cladding layer, said active layer, and said semiconductor substrate to form a mesa structure is performed by a reactive ion etching method.

4. A method according to claim 1, wherein said n-type group III-V semiconductor substrate consists of InP.

5. A method according to claim 1, wherein said current confining layer uses an Se dopant having a concentration of not less than $5\times10^{18}$ atoms·cm$^{-3}$.

6. A method according to claim 1, wherein said mask is removed after said current confining layer is formed.

7. A method according to claim 1, wherein said mask is removed after said mesa structure is formed.

8. A method according to claim 7, wherein said current confining layer uses an Se dopant having a concentration of not less than $8\times10^{18}$ atoms·cm$^{-3}$.

9. A method of manufacturing a buried heterostructure semiconductor laser, comprising the steps of:

sequentially depositing an active layer, a p-type cladding layer, and a p-type cap layer on n-type group III-V semiconductor substrate by the metalorganic vapor phase epitaxy;

masking a surface of said deposited layer in a stripe shape and selectively and partially etching said cap layer, said cladding layer, said active layer, and part of said semiconductor substrate to form a mesa structure; and sequentially depositing a p-type current blocking layer, an n-type current confining layer containing a group VI dopant having a concentration of not less than $5\times10^{18}$ atoms·cm$^{-3}$ by the metalorganic vapor phase epitaxy to form current constraint and optical confinement layers.

10. A method according to claim 9, wherein said n-type semiconductor substrate consists of an n-type semiconductor substrate (1a) and an n-type buffer layer (1b) formed on said n-type semiconductor substrate (1a).

11. A method according to claim 9, wherein the step of selectively and partially etching said cladding layer, said active layer, and said semiconductor substrate to form a mesa structure is performed by a reactive ion etching method.

12. A method according to claim 9, wherein said n-type group III-V semiconductor substrate consists of InP.

13. A method according to claim 9, wherein said current confining layer uses an Se dopant having a concentration of not less than $5 \times 10^{18}$ atoms·cm$^{-3}$.

14. A method according to claim 9, wherein said mask is removed after said current confining layer is formed.

15. A method of manufacturing a buried heterostructure semiconductor laser, comprising the steps of:

depositing an active layer on an n-type group III-V semiconductor substrate by metalorganic vapor phase epitaxy;

masking a surface of said active layer in a stripe shape and selectively partially etching said active layer and part of said semiconductor substrate to form a mesa structure; and removing said mask on the upper layer of said mesa structure, and depositing a p-type current blocking layer, an n-type current confining layer containing a group VI dopant having a concentration of not less than $5 \times 10^{18}$ atoms·cm$^{-3}$, a p-type cladding layer, and a p-type cap layer on an entire surface of the resultant structure by the metalorganic vapor phase epitaxy.

16. A method according to claim 15, wherein said n-type semiconductor substrate consists of an n-type semiconductor substrate (1a) and an n-type buffer layer (1b) formed on said n-type semiconductor substrate (1a).

17. A method according to claim 15, wherein the step of selectively and partially etching said active layer and said semiconductor substrate to form a mesa structure is performed by a reactive ion etching method.

18. A method according to claim 15, wherein said n-type group III-V semiconductor substrate consists of InP.

19. A method according to claim 15, wherein said current confining layer uses an Se dopant having a concentration of not less than $8 \times 10^{18}$ atoms·cm$^{-3}$.

20. A method of manufacturing a buried heterostructure semiconductor laser, comprising the steps of:

depositing an active layer on an n-type group III-V semiconductor substrate by metalorganic vapor phase epitaxy;

growing said active layer, growing an optical waveguide layer, and forming a diffraction grating in said optical waveguide layer;

masking the surface of said optical waveguide layer in a stripe shape after the diffraction grating is formed, and selectively and partially etching said optical waveguide layer, said active layer, and part of said semiconductor substrate to form a mesa structure; and removing said mask on the upper layer of said mesa structure, and depositing a p-type current blocking layer, an n-type current confining layer containing a group VI dopant having a concentration of not less than $5 \times 10^{18}$ atoms·cm$^{-3}$, and a p-type cladding layer, and a p-type cap layer on an entire surface of the resultant structure by the metalorganic vapor phase epitaxy.

21. A method according to claim 20, wherein said n-type group III-V semiconductor substrate consists of InP.

22. A method according to claim 20, wherein said current confining layer uses an Se dopant having a concentration of not less than $8 \times 10^{18}$ atoms·cm$^{-3}$.

* * * * *